(12) United States Patent
Ishibashi

(10) Patent No.: US 9,911,714 B2
(45) Date of Patent: Mar. 6, 2018

(54) LEAD FRAME

(71) Applicant: Mitsui High-Tec, Inc., Fukuoka (JP)

(72) Inventor: Takahiro Ishibashi, Fukuoka (JP)

(73) Assignee: MITSUI HIGH-TEC, INC., Fukuoka (JP)

( * ) Notice: Subject to any disclaimer, the term of this patent is extended or adjusted under 35 U.S.C. 154(b) by 310 days.

(21) Appl. No.: 14/146,201

(22) Filed: Jan. 2, 2014

(65) Prior Publication Data

US 2014/0192506 A1 Jul. 10, 2014

(30) Foreign Application Priority Data

Jan. 10, 2013 (JP) ................................. 2013-002599

(51) Int. Cl.
*H05K 7/18* (2006.01)
*H01L 23/00* (2006.01)

(52) U.S. Cl.
CPC .... *H01L 24/97* (2013.01); *H01L 2224/48091* (2013.01); *H01L 2224/48247* (2013.01); *H01L 2924/181* (2013.01)

(58) Field of Classification Search
CPC ...................................................... H01L 24/97
See application file for complete search history.

(56) References Cited

U.S. PATENT DOCUMENTS

| 6,627,981 | B2 | 9/2003 | Shibata | |
| 7,033,866 | B2 * | 4/2006 | Chow et al. | 438/123 |
| 7,087,986 | B1 * | 8/2006 | Bayan | H01L 23/3107 257/676 |
| 7,259,460 | B1 | 8/2007 | Bayan et al. | |
| 7,943,431 | B2 * | 5/2011 | San Antonio et al. | 438/123 |
| 2001/0035569 | A1 | 11/2001 | Shibata | |
| 2006/0033184 | A1 * | 2/2006 | Park et al. | 257/666 |
| 2007/0077732 | A1 * | 4/2007 | Ito et al. | 438/460 |
| 2012/0009737 | A1 * | 1/2012 | Kuratomi et al. | 438/112 |

FOREIGN PATENT DOCUMENTS

| JP | 4-130653 | 5/1992 |
| JP | 2001-313363 | 11/2001 |
| JP | 2003-338599 | 11/2003 |
| JP | 2005-166695 | 6/2005 |
| JP | 2010-166100 | 7/2010 |

* cited by examiner

*Primary Examiner* — Robert Carpenter

(74) *Attorney, Agent, or Firm* — Greenblum & Bernstein, P.L.C.

(57) ABSTRACT

A lead frame includes adjacent die pads which lie adjacent to each other; grounding leads extended from the adjacent die pads; a connecting bar by which the grounding leads extended from the adjacent die pads are interconnected. The grounding leads and the connecting bar are formed to be thinner at one surface than a maximum thickness of leads of the lead frame, the grounding leads extended from the adjacent die pads are aligned on a common axis while providing the connecting bar between the grounding leads, and a support projection is provided at the one surface on the connecting bar in the common axis.

6 Claims, 8 Drawing Sheets

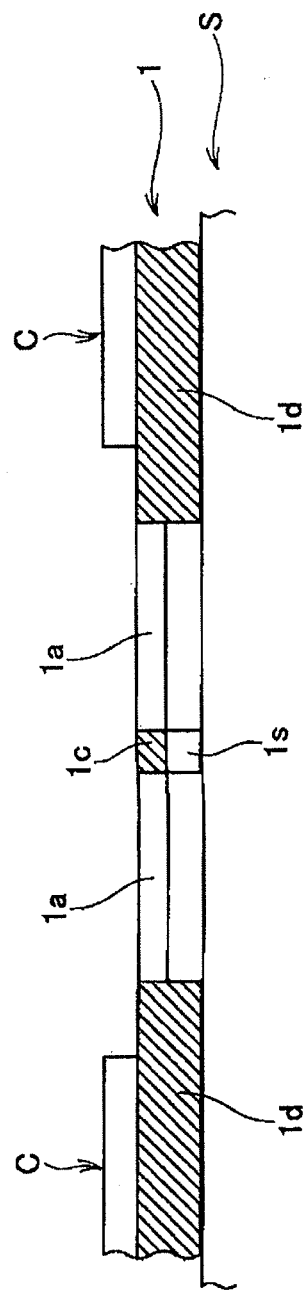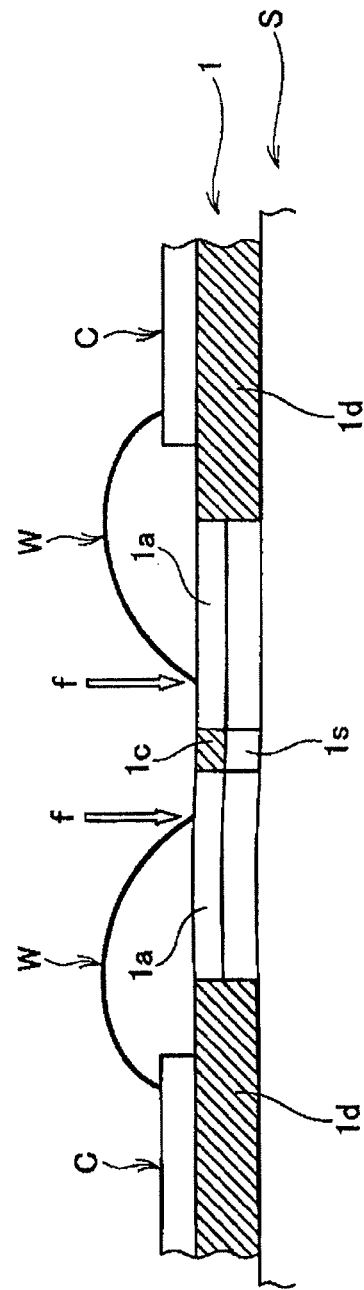

LEAD FRAME

CROSS-REFERENCE TO RELATED APPLICATIONS

This application is based upon and claims the benefit of priority of Japanese Patent Application No. 2013-002599 filed on Jan. 10, 2013, the contents of which are incorporated herein by reference in its entirety.

BACKGROUND OF THE INVENTION

1. Field of the Invention

The present invention is directed to a lead frame for manufacturing a semiconductor apparatus by a MAP (Molded Array Process) scheme, and relates to a lead frame in which grounding leads which are extended from adjacent die pads are interconnected via a connecting bar.

2. Description of the Related Art

Recently, when a QFN package (Quad Flat Non-leaded Package) as one form of a semiconductor apparatus is manufactured, it is promoted to adopt a MAP (Molded Array Process) scheme in which a plurality of semiconductor chips are collectively sealed on a lead frame, and then individual semiconductor apparatuses are individualized by dicing.

Even for a lead frame for manufacturing a semiconductor apparatus in the MAP scheme, a technique is used in which electrode terminals of a semiconductor chip mounted on a die pad and external electrode terminals (terminal leads) provided around the die pad are connected to each other by bonding wires. See JP-A-2001-313363, for example.

When the semiconductor apparatus is manufactured, it is necessary to connect die pads to grounding terminals of the semiconductor chip using bonding wires. In recent years, however, since the drastic miniaturization of the package is advanced, a problem may be raised that the bonding wires are hardly connected to the die pad if the dimensions of the die pad are equal to or smaller than the semiconductor chip.

An improved lead frame is provided to solve the problem. The improved lead frame is configured to form grounding leads extended from the die pad and connect the grounding leads and the grounding terminals of the semiconductor chip by using the bonding wires.

A lead frame LF in a related art as shown in FIG. 6 includes a plurality of unit lead frames FU, FU . . . arranged in a matrix. Grounding leads Fa are formed in a die pad Fd in each of the unit lead frames FU. Grounding leads Fa, Fa which are extended from adjacent die pads Fd are interconnected via a connecting bar Fc which is extended along a dicing line D.

As shown in FIGS. 7A and 7B, the grounding leads Fa of the lead frame LF and the connecting bar Fc are subjected to half-etching from a rear side (a mounting surface) to be thinned in normal cases. A grounding terminal of a semiconductor chip C on the die pad Fd is connected to the grounding lead Fa via a bonding wire W.

When the QFN package is manufactured by using the lead frame LF, firstly, the semiconductor chip C is mounted and bonded on the die pad Fd, and then, an external electrode terminal Ft and an electrode terminal of the semiconductor chip C are connected via a bonding wire W, and the grounding lead Fa and a grounding terminal of the semiconductor chip C are connected via another bonding wire W.

Subsequently, all of the semiconductor chips C, C . . . on the lead frame LF and the bonding wires W, W . . . are collectively sealed with a mold resin. Then, a dicing is performed to remove the connecting bar Fc and the lead frame LF is split into unit lead frames FU, FU . . . , whereby the individual semiconductor apparatuses are individualized as a product.

In a process of manufacturing the above semiconductor apparatus, if the thickness of the connecting bar Fc is the same as a base material of the lead frame LF, a load becomes large in cutting due to the thickness of a cutting portion. In this case, a problem is raised that cutting burr may be occurred because the dicing blade is shortly worn, thereby dicing property (cutting capability) of the blade is deteriorated Accordingly, in the lead frame LF as mentioned above, as shown in FIGS. 7A and 7B, whole of dam bars such as the connecting bar Fc and the grounding leads Fa are subjected to half-etching from the rear side (the mounting surface) to be thinned. See JP-A-2005-166695, for example. By adopting this structure, a wear of the dicing blade in cutting process is suppressed, and the occurrence of the cutting burr is possibly avoided.

SUMMARY OF THE INVENTION

In the lead frame LF in the related art, the grounding leads Fa, Fa and the connecting bar Fc are subjected to half-etching from the rear side (the mounting surface) to be thinned. After the semiconductor chips C are bonded on the die pad Fd of the lead frame LF on a working stage S as shown in FIG. 8A, the bonding wires W are connected to the grounding leads Fa, Fa of the lead frame LF on the working stage S. In this case, as shown in FIG. 8B, because no supports exist on the rear side, the grounding leads Fa, Fa are bent and deformed downwards due to the depression force f, f generated when ends of the bonding wires W are connected, thereby raising a problem that a connectivity of the bonding wire W with respect to the grounding lead Fa is lowered.

In consideration with the above, the present invention is directed to a lead frame for manufacturing a semiconductor apparatus in the MAP scheme. An object of the present invention is to provide a lead frame to achieve an enhancement of a connectivity of a bonding wire with respect to a grounding lead by preventing a deformation of the grounding lead in wire bonding in advance.

A first aspect of the present invention provides a lead frame including: adjacent die pads which lie adjacent to each other; grounding leads extended from the adjacent die pads; a connecting bar by which the grounding leads extended from the adjacent die pads are interconnected, wherein the grounding leads and the connecting bar are formed to be thinner at one surface than a maximum thickness of leads of the lead frame, the grounding leads extended from the adjacent die pads are aligned on a common axis while providing the connecting bar between the grounding leads, and a support projection is provided at the one surface on the connecting bar in the common axis.

A second aspect of the present invention provides a lead frame according to the first aspect, wherein a width dimension of the support projection in the connecting bar is the same as a width dimension of the connecting bar.

A third aspect of the present invention provides a lead frame according to the first aspect, wherein a width dimension of the support projection in the connecting bar is larger than a width dimension of the connecting bar and smaller than a width dimension of a dicing line, along which the connecting bar is removed.

A fourth aspect of the present invention provides a lead frame according to the first aspect, wherein a width dimension of the support projection in the grounding lead is the same as a width dimension of the grounding lead.

According to the lead frame of the first aspect of the present invention, the grounding leads extended from the adjacent die pads are aligned on a common axis while providing the connecting bar between the grounding leads, and a support projection is provided at the one surface on the connecting bar in the common axis. Accordingly, even if the grounding leads and the connecting bar are formed to be thinned by half etching from the one surface side, the support projection which is provided on the one side of the connecting bar functions as a support when the bonding wire is connected to the grounding lead on the working stage. Thus, the grounding leads are hardly bent and deformed downwards due to the depression force generated when an end of the bonding wire is connected, thereby preventing a connectivity of the bonding wire with respect to the grounding lead from lowered in advance.

According to the lead frame of the second aspect of the present invention, the width dimension of the support projection in the connecting bar is the same as the width dimension of the connecting bar. Thus, it is possible to secure the sufficient supporting property due to the existence of the support projection and possibly suppress a wear of a dicing blade.

According to the lead frame of the third aspect of the present invention, the width dimension of the support projection in the connecting bar is larger than the width dimension of the connecting bar and smaller than the width dimension of the dicing line. Thus, it is possible to secure the better sufficient supporting property due to the existence of the support projection while the suppression of the wear of the dicing blade is slightly deteriorated.

According to the lead frame of the fourth aspect of the present invention, the width dimension of the support projection in the grounding lead is the same as the width dimension of the grounding lead. Thus, it is possible to secure the sufficient supporting property due to the existence of the support projection and possibly suppress the wear of the dicing blade.

BRIEF DESCRIPTION OF THE DRAWINGS

In the accompanying drawings:

FIG. 3A is a cross-sectional view of a portion showing a process of mounting a semiconductor chip on the lead frame;

FIG. 3B is a cross-sectional view of a portion showing a process of wire bonding to the lead frame;

DETAILED DESCRIPTION OF THE EXEMPLARY EMBODIMENTS

A lead frame according to an exemplary embodiment of the present invention will be described in detail with reference to accompanying drawings.

Figure 1:
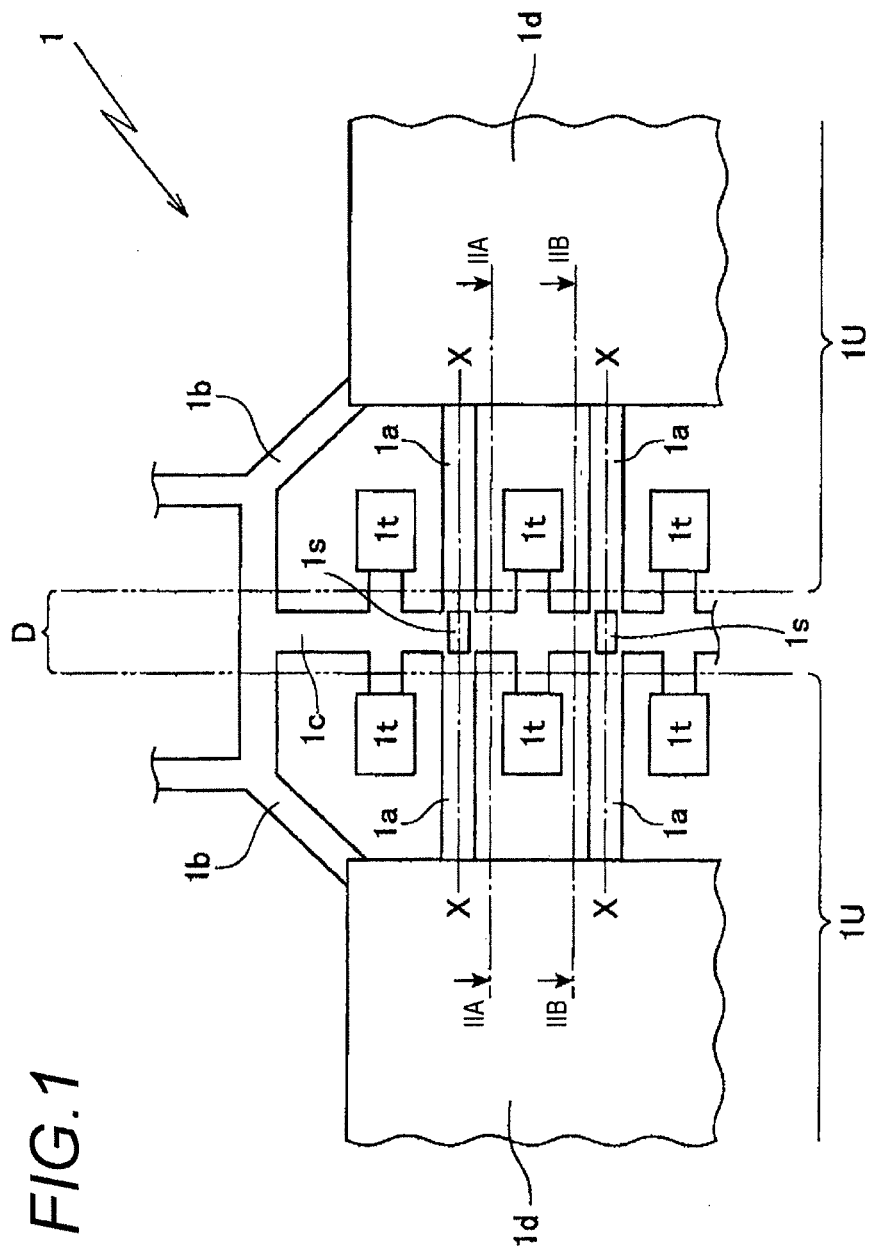
FIG. 1 is a bottom view showing a lead frame according to an embodiment of the present invention.
Figure 2A:
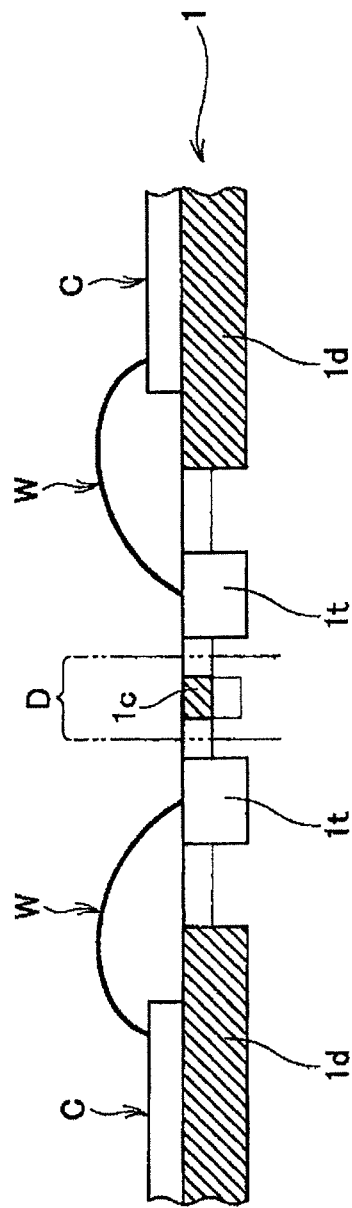
FIG. 2A is a cross-sectional view taken along a line IIA-IIA in FIG. 1.
Figure 2B:
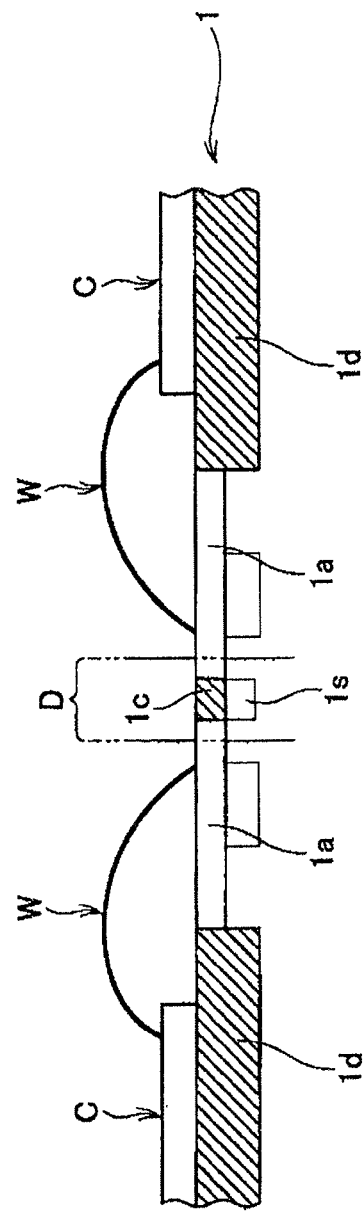
FIG. 2B is a cross-sectional view taken along a line IIB-IIB in FIG. 1.

FIGS. 1, 2A and 2B show a lead frame according to an embodiment of the present invention for manufacturing a QFN package (Quad Flat Non-leaded Package) as a form of a semiconductor apparatus in a MAP (Molded Array Process) scheme.

A lead frame 1 according to the embodiment include a plurality of unit lead frames 1U, 1U, . . . arranged in a matrix. Each of the unit lead frames 1U includes a die pad 1d having a rectangular shape, and a plurality of external electrode terminals (terminal leads) 1t, 1t, . . . arranged around the die pad 1d.

A grounding lead 1a is integrally formed and extended from the die pad 1d of each unit lead frame 1U. The grounding leads 1a, 1a, which are extended respectively from the adjacent die pads 1d, 1d in the adjacent unit lead frames 1U, 1U, are interconnected via a connecting bar 1c. The connecting bar 1c is extended along a dicing line D along which the connecting bar 1c is removed as described below.

As shown in FIG. 1, the grounding leads 1a, 1a, which are extended from the adjacent die pads 1d, 1d, are aligned in a common straight line X-X while providing the connecting bar 1c between the grounding leads 1a, 1a.

In the lead frame 1, whole of dam bar including the grounding leads 1a, support bars 1b, and the connecting bar 1c is formed to be thinned by half-etching from a rear side (a mounting surface). Namely, the dam bar is formed at the rear side (one side) to be thinner than a maximum length of leads of the lead frame 1.

In addition, a support projection 1s having a substantially rectangular cuboid block is formed on the rear side of the connecting bar 1c in the straight line X-X in which the grounding leads 1a, 1a are extended while providing the connecting bar 1c therebetween.

The support projection 1s is formed to be projected by remaining, without etching, a portion corresponding to the support projection 1s when the grounding lead 1a, the connecting bar 1c and the like are half-etched from the rear side (the mounting surface).

As shown in FIG. 2A, the external electrode terminals 1t of the lead frame are connected to grounding terminals of the semiconductor chip C by bonding wires W. Further, as shown in FIG. 2B, the grounding leads 1a of the lead frame 1 are connected to grounding terminals of the semiconductor chip C by bonding wires W.

A process for manufacturing the QFN package by using the lead frame 1 will be described below. Firstly, the semiconductor chip C is mounted and bonded on the die pad 1d, and then, the external electrode terminal 1t and the electrode terminal of the semiconductor chip C are connected via the bonding wire W, and the grounding lead 1a and the grounding terminal of the semiconductor chip C are connected via the bonding wire W.

Subsequently, all of the semiconductor chips C, C . . . on the lead frame 1 and the bonding wires W, W . . . are collectively sealed with a mold resin. Then, a dicing is performed to remove the connecting bar 1c along the dicing line D and the lead frame 1 is split into unit lead frames 1U, 1U . . . , whereby the individual semiconductor apparatuses are individualized as a product.

In the lead frame 1 according to the embodiment, after the semiconductor chips C are mounted and bonded on the die pad 1d of the lead frame 1 on a working stage S as shown in FIG. 3A, the bonding wires W are connected to the grounding leads 1a, 1a of the lead frame 1 on the working stage S. In this case, as shown in FIG. 3B, the support projection 1s which is provided on the rear side of the connecting bar 1c contacts the working stage S, and the support projection 1s supports the grounding lead 1a and the connecting bar 1c.

According to this structure, even if the grounding leads 1a and the connecting bar 1c are formed to be thinned, the grounding leads 1a are hardly bent and deformed downwards due to the depression force f generated when ends of the bonding wires W are connected, thereby preventing a connectivity of the bonding wire W with respect to the grounding lead 1a from lowered in advance.

Figure 4A:
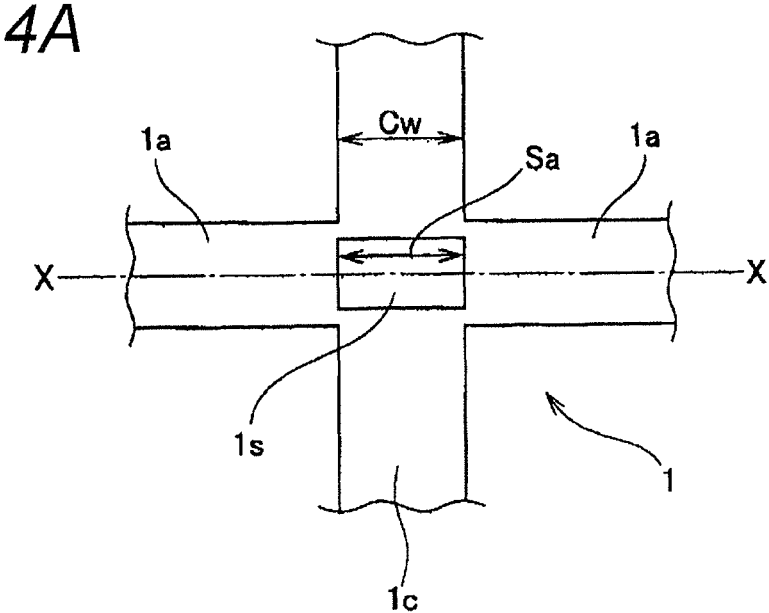
FIGS. 4A and 4B are bottom views showing a support unit of the lead frame.

FIG. 4A shows an example of the support projection 1s of the lead frame 1. In this example, it is configured that a width dimension Sa of the support projection 1s in the connecting bar 1c is the same as a width dimension Cw of the connecting bar 1c.

According to this configuration, the dimension Sa of the support projection 1s is suppressed with securing a sufficient supporting property. Further, since the volume of the support projection 1s (a metallic part which is cut by a dicing blade) is suppressed, a wear of the dicing blade is possibly avoided.

Figure 4B:
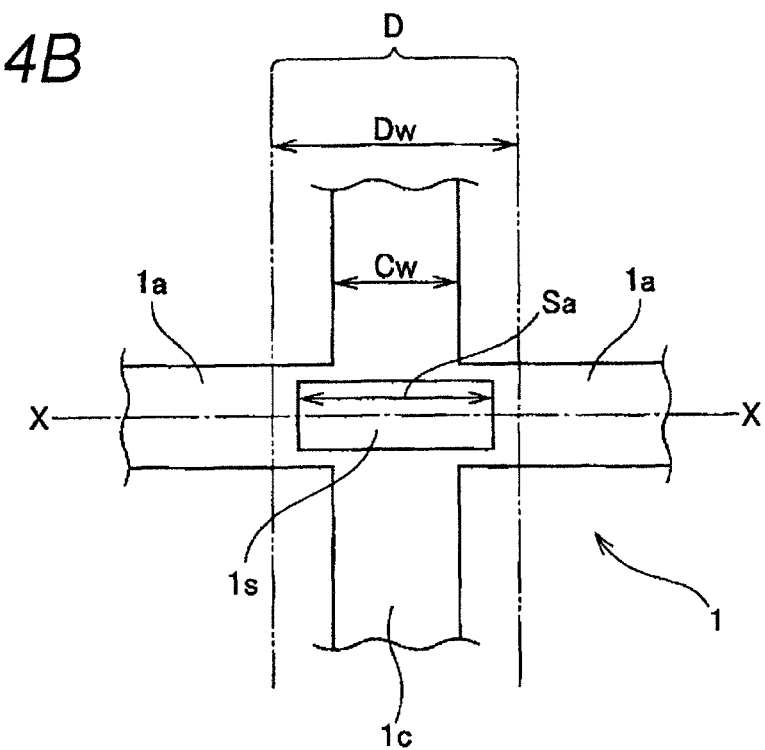

FIG. 4B shows another example of the support projection 1s of the lead frame 1. In this example, it is configured that a width dimension Sa of the support projection 1s in the connecting bar 1c is larger than a width dimension Cw of the connecting bar 1c and smaller than a width dimension Dw of the dicing line D.

According to this configuration, since the dimension Sa is larger than that of the support projection 1s shown in FIG. 4A, the volume of the support projection 1s is increased, whereby the wear resistance of the dicing blade is lowered. However, it is possible to secure the better supporting capability due to the existence of the support projection 1s.

Figure 5A:
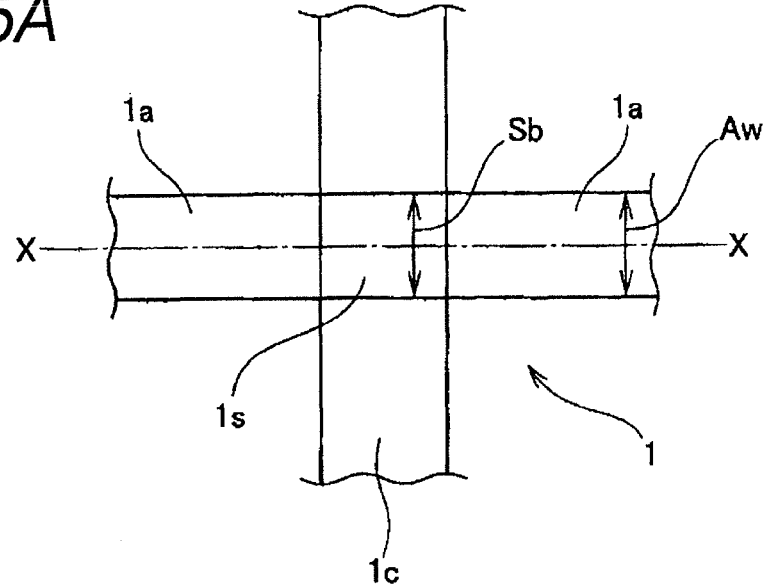
FIGS. 5A and 5B are bottom views showing a support unit of the lead frame.

FIG. 5A shows still another example of the support projection 1s of the lead frame 1. In this example, it is configured that a width dimension Sb of the support projection 1s in the grounding lead 1a is the same as a width dimension Aw of the grounding lead 1a.

According to this configuration, the dimension Sb of the support projection 1s is suppressed with securing a sufficient supporting property, especially for an advantage that twisting with respect to the longitudinal axis of the grounding lead 1a is prevented. Further, since the volume of the support projection 1s is suppressed, a wear of the dicing blade is possibly avoided.

Figure 5B:
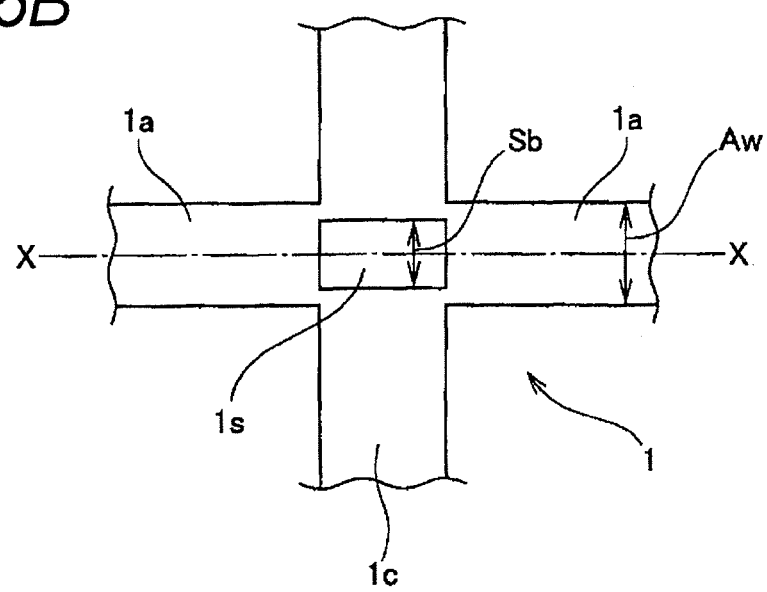
Figure 6:
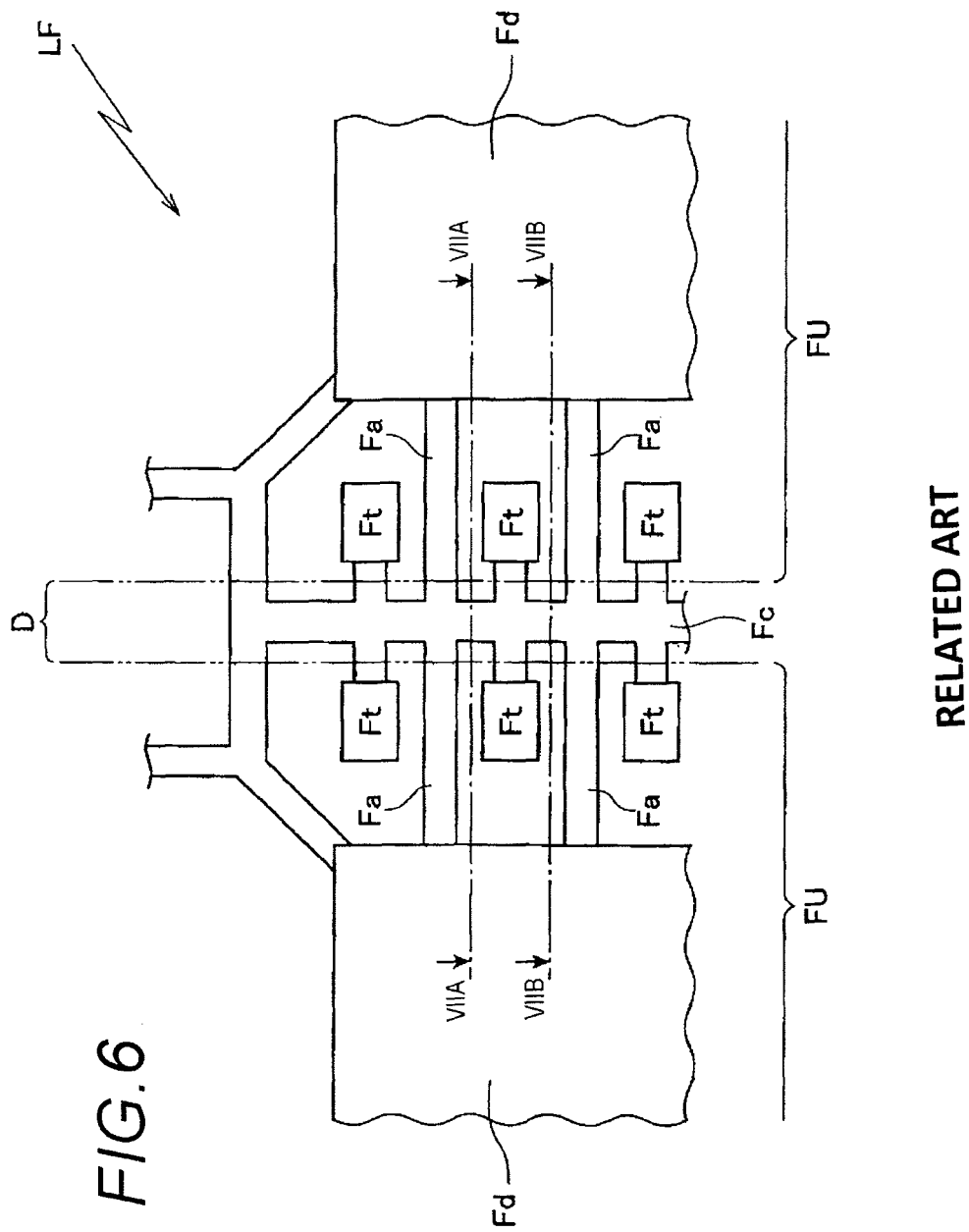
FIG. 6 is a bottom view of a portion showing a lead frame in a related art.
Figure 7A:
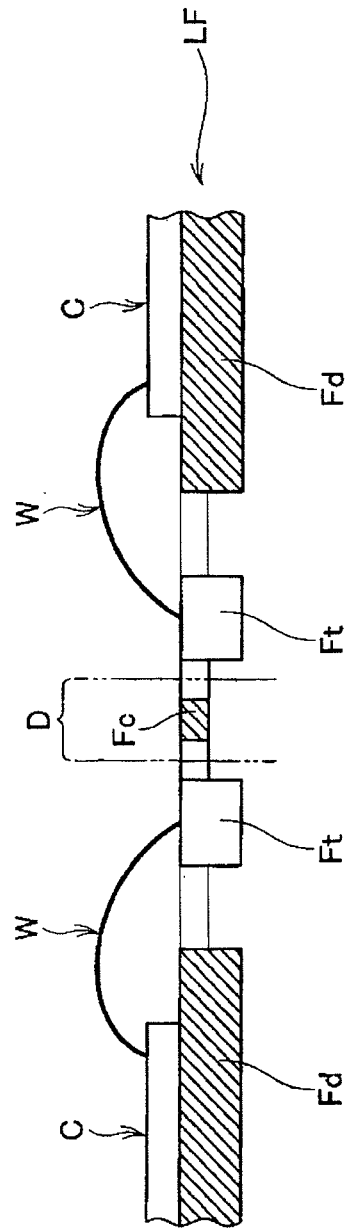
FIG. 7A is a cross-sectional view taken along a line VIIA-VIIA in FIG. 6.
Figure 7B:
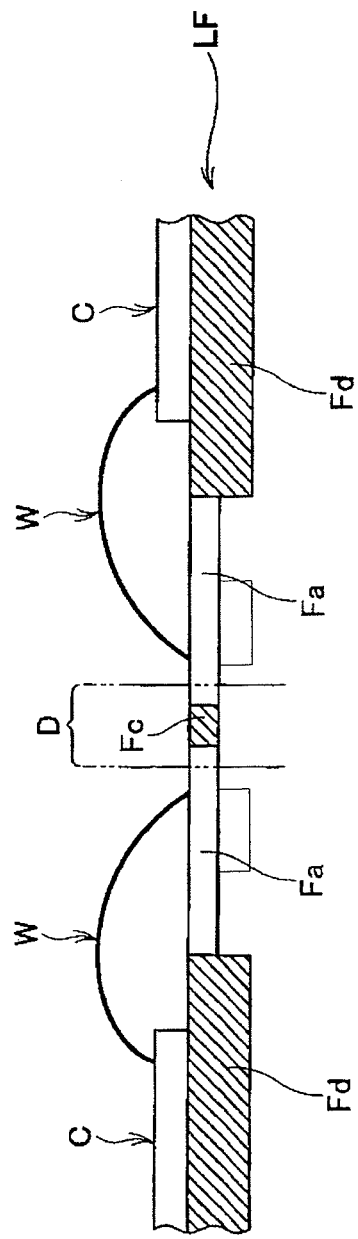
FIG. 7B is a cross-sectional view taken along a line VIIB-VIIB in FIG. 6.
Figure 8A:
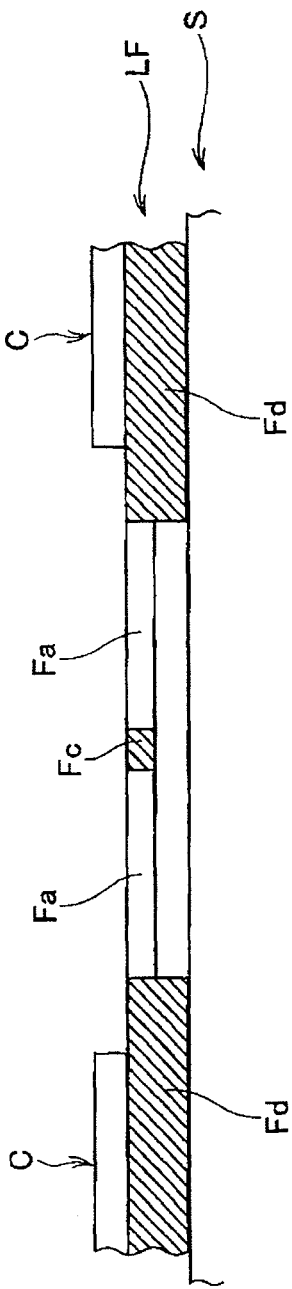
FIG. 8A is a cross-sectional view showing a process of mounting a semiconductor chip on the lead frame in the related art.
Figure 8B:
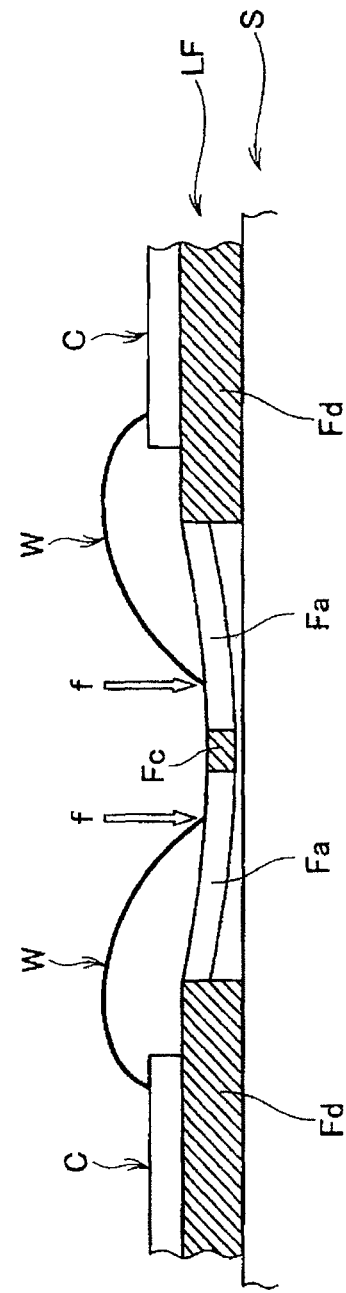
FIG. 8B is a cross-sectional view of showing a process of wire bonding to the lead frame in the related art.

FIG. 5B shows further another example of the support projection 1s of the lead frame 1. In this example, it is configured that a width dimension Sb of the support projection 1s in the grounding lead 1a is larger than 0.05 mm and smaller than a width dimension Aw of the grounding lead 1a.

According to this configuration, the dimension Sb of the support projection 1s is possibly suppressed with securing a sufficient supporting property (preventing twisting with respect to the longitudinal axis of the grounding lead 1a).

Further, since the volume of the support projection 1s is possibly suppressed, a wear of the dicing blade is possibly avoided.

What is claimed is:

1. A lead frame, comprising:
at least two unit lead frames and a boundary area between the unit lead frames;
adjacent die pads which are respectively provided in the unit lead frames and which lie adjacent to each other;
grounding leads extended from the adjacent die pads, wherein bonding wires are connected to the grounding leads;
external electrode terminals arranged outside of the die pads that are provided in the unit lead frames, wherein a thickness of the external electrode terminals is the same as a maximum thickness of leads of the lead frame, and bonding wires are connected to the external electrode terminals;
terminal leads interconnecting the external electrode terminals between the adjacent die pads;
a connecting bar, by which the grounding leads extended from the adjacent die pads and the terminal leads extended between the external electrode terminals are interconnected, is provided in the boundary area between the unit lead frames, wherein
the terminal leads, the grounding leads and the connecting bar are formed to be thinner at one surface than a maximum thickness of leads of the lead frame,
the grounding leads extended from the adjacent die pads are aligned on a common axis while providing the connecting bar between the grounding leads, and
a support projection is provided at the one surface on the connecting bar in the common axis, and
no support projection is provided at the one surface on the connecting bar in a region in which the terminal leads and the connecting bar cross each other.

2. The lead frame according to claim 1, wherein the external electrode terminals are connected via the bonding wires to electrode terminals of semiconductor chips to be mounted on the adjacent die pads, and the grounding leads are connected via the bonding wires to grounding terminals of the semiconductor chips.

3. The lead frame according to claim 1, wherein a full width of a free end of the support projection provided on the connecting bar is the same as a full width of the connecting bar.

4. The lead frame according to claim 1, wherein a full width of a free end of the support projection provided on the grounding lead is the same as a full width of the grounding lead.

5. A lead frame, comprising:
adjacent die pads which lie adjacent to each other;
grounding leads extended from the adjacent die pads, wherein bonding wires are connected to the grounding leads;
a connecting bar by which the grounding leads extended from the adjacent die pads are interconnected, wherein
the grounding leads and the connecting bar are formed to be thinner at one surface than a maximum thickness of leads of the lead frame,
the grounding leads extended from the adjacent die pads are aligned on a common axis while providing the connecting bar between the grounding leads, and
a support projection is provided at the one surface on the connecting bar in the common axis, wherein a full width of a free end of the support projection provided on the connecting bar is the same as a full width of the connecting bar.

6. A lead frame, comprising:

adjacent die pads which lie adjacent to each other;

grounding leads extended from the adjacent die pads, wherein bonding wires are connected to the grounding leads;

a connecting bar by which the grounding leads extended from the adjacent die pads are interconnected, wherein the grounding leads and the connecting bar are formed to be thinner at one surface than a maximum thickness of leads of the lead frame, the grounding leads extended from the adjacent die pads are aligned on a common axis while providing the connecting bar between the grounding leads, and a support projection is provided at the one surface on the connecting bar in the common axis, wherein a full width of the support projection provided on the grounding lead is the same as a full width of the grounding lead.

* * * * *